United States Patent
Zastrow

(10) Patent No.: US 9,880,901 B2
(45) Date of Patent: *Jan. 30, 2018

(54) SERIAL BUS DRAM ERROR CORRECTION EVENT NOTIFICATION

(71) Applicant: Integrated Silicon Solution, Inc., Milpitas, CA (US)

(72) Inventor: Lyn R. Zastrow, Prosper, TX (US)

(73) Assignee: Integrated Silicon Solution, Inc., Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/354,773

(22) Filed: Nov. 17, 2016

(65) Prior Publication Data

US 2017/0132075 A1 May 11, 2017

Related U.S. Application Data

(63) Continuation-in-part of application No. 14/279,113, filed on May 15, 2014, now Pat. No. 9,529,667.

(51) Int. Cl.
*H03M 13/00* (2006.01)
*G06F 11/10* (2006.01)
*G11C 29/52* (2006.01)

(52) U.S. Cl.
CPC ...... *G06F 11/1068* (2013.01); *G06F 11/1048* (2013.01); *G06F 11/1076* (2013.01); *G11C 29/52* (2013.01)

(58) Field of Classification Search
CPC .................................................. G06F 11/1076
USPC ......................................................... 714/764
See application file for complete search history.

(56) References Cited

U.S. PATENT DOCUMENTS

| | | |
|---|---|---|
| 8,271,701 B1 | 9/2012 | Nguyen |
| 9,529,667 B2 * | 12/2016 | Zastrow .............. G06F 11/1048 |
| 2008/0133985 A1 | 6/2008 | Riho |
| 2011/0004805 A1 | 1/2011 | Seo |
| 2011/0138252 A1 | 6/2011 | Pawlowski |
| 2013/0117641 A1 | 5/2013 | Bains |
| 2013/0339821 A1 | 12/2013 | Cordero |
| 2014/0016419 A1 | 1/2014 | Hold |
| 2014/0126302 A1 | 5/2014 | Yoon |

* cited by examiner

*Primary Examiner* — Guy Lamarre
(74) *Attorney, Agent, or Firm* — Innovation Counsel LLP

(57) ABSTRACT

A memory device incorporates a serial data bus coupled to the control circuit of the memory device to provide direct access to the error correction control circuit and to the error correction event notification information and error correction function configuration information stored in mode registers of the control circuit. The serial data bus enables access to the error correction control functions and to the error correction event notification information without requiring modifications to the memory controller used to control and communicate with the memory device.

22 Claims, 6 Drawing Sheets

Mode Register Assignment

| MR# | MA<7:0> | Function | Access | OP7 | OP6 | OP5 | OP4 | OP3 | OP2 | OP1 | OP0 |
|---|---|---|---|---|---|---|---|---|---|---|---|
| 0 | 00H | Device Info. | R | ECC Event | | | | | | DI | DAI |
| 1 | 01H | Device Feature1 | W | nWR (for AP) | | | WC | BT | | | BL |
| 2 | 02H | Device Feature2 | W | | | | | | RL & WL | | |
| ... | | | | | | | | | | | |
| 11 | 0BH | Clear ECC Event | W | ECC On/Off | | | | | | PIN | CLR ECC |
| 12 | 0CH | Memory Bank of ECC Event | R | Memory Bank ID | | | | | | | |
| 13 | 0DH | Address (MSB bits) of ECC Event | R | High Address Word (ADDR-H) | | | | | | | |
| 14 | 0EH | Address (LSB bits) of ECC Event | R | Low Address Word (ADDR-L) | | | | | | | |
| 15 | 0FH | Reserved | | | | | | | | | |

FIG. 3

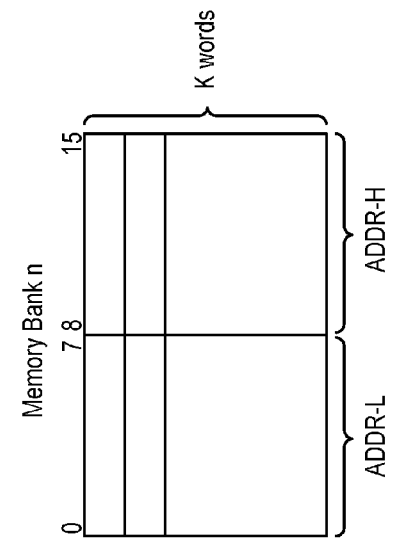

FIG. 2

Mode Register Assignment ⟵300

| MR# | MA<7:0> | Function | Access | OP7 | OP6 | OP5 | OP4 | OP3 | OP2 | OP1 | OP0 |
|---|---|---|---|---|---|---|---|---|---|---|---|
| 0 | 00$_H$ | ECC Event | R | ECC On/Off | | | | | | | ECC Event |
| 1 | 01$_H$ | Clear ECC Event | W | | | | CLR ECC | | | | |
| 2 | 02$_H$ | ECC Pin | W | PIN | | | | | | | |
| 3 | 0B$_H$ | Reserved | | | | | | | | | |
| 4 | 0C$_H$ | Memory Bank of ECC Event | R | Memory Bank ID ||||||||
| 5 | 0D$_H$ | Address (MSB bits) of ECC Event | R | High Address Word (ADDR-H) ||||||||
| 6 | 0E$_H$ | Address (LSB bits) of ECC Event | R | Low Address Word (ADDR-L) ||||||||
| 7 | 0F$_H$ | Reserved | | | | | | | | | |

FIG. 7

SERIAL BUS DRAM ERROR CORRECTION EVENT NOTIFICATION

CROSS REFERENCE TO OTHER APPLICATIONS

This application is a continuation-in-part of U.S. patent application Ser. No. 14/279,113, entitled DRAM ERROR CORRECTION EVENT NOTIFICATION, filed May 15, 2014, now U.S. Pat. No. 9,529,667, issued Dec. 27, 2016, which application is incorporated herein by reference for all purposes.

BACKGROUND OF THE INVENTION

Modern day semiconductor memories have been produced with very high storage capacities (hundreds of millions of bits) with scaling down of transistors and the power source voltage. However, an incremental increase in storage capacity with low power source voltage tends to reduce the reliability of these memory devices. For example, the scaling down of transistor has reduced the capacitance in each memory cell, often resulting in random one-bit error due to cosmic radiation or alpha radiation or other random event. There are also coupling effects internal to the silicon, silicon aging effects, and DRAM bits changing state before a refresh due to increased temperatures. These random one-bit errors occur frequently enough that such errors can no longer be ignored as these devices are employed into systems where a bit-error could have a catastrophic consequence. The increase in the number of cells in memory devices tends to reduce the mean time to failure (MTTF) of the entire memory device. As a result, the level of reliability required for the memory device become increasingly stringent. In some applications, semiconductor memory devices have been implemented with error correction to improve the reliability of the memory devices.

Error correction code (ECC) is a technique that can be used to reduce or recover bit errors in memory devices. A well know error correction code is the Hamming code, which appends a series of check bits to a data word as the data word is stored in the memory device. Upon a read operation, the retrieved check bits are compared to recalculated check bits to detect and correct bit errors in the read out data. By adding more check bits and appropriately overlapping the subsets of data bits represented by the check bits, these error correcting codes may provide for multiple error corrections and detection. ECC error correction operation is performed transparent to the user or to the system in which the memory device is incorporated. The read out data from the memory device bears no distinction between original data or corrected data.

BRIEF DESCRIPTION OF THE DRAWINGS

Various embodiments of the invention are disclosed in the following detailed description and the accompanying drawings.

FIG. 2 illustrates a memory bank n of the memory device 10 organized as K words of 16-bit memory data in one example.

FIG. 3 illustrates mode register assignments for a set of mode registers which can be incorporated into the memory device of FIG. 1 to implement the error correction event notification method in embodiments of the present invention.

FIG. 7 illustrates mode register assignments for a set of mode registers which can be incorporated into the memory device of FIG. 5 to implement the error correction event notification method using a serial bus in embodiments of the present invention.

DETAILED DESCRIPTION

Figure 1:
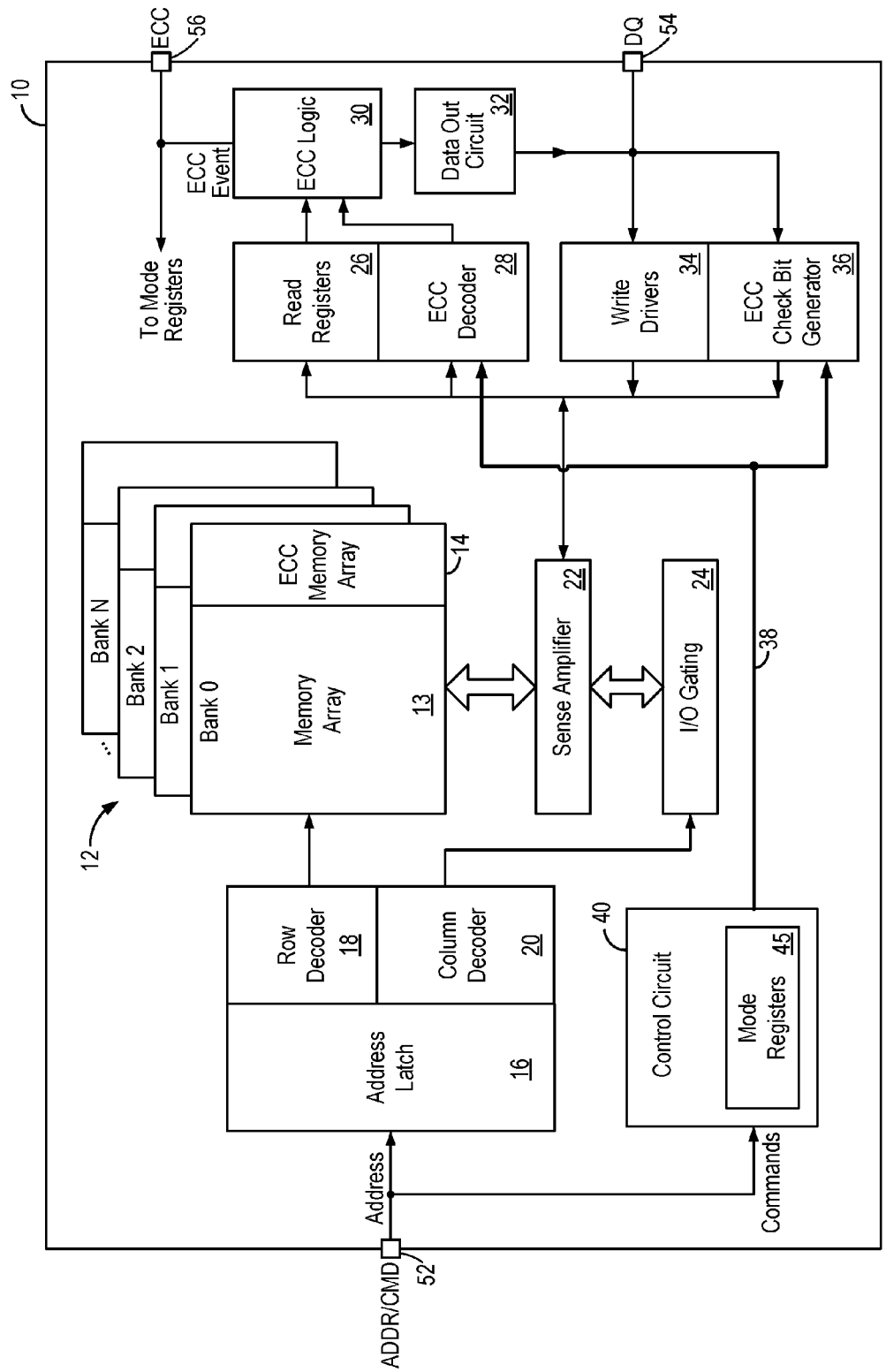
FIG. 1 is a block diagram of a memory device implementing the error correction event notification method in embodiments of the present invention.

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

In embodiments of the present invention, a memory device implementing error correction is configured to record the memory location of an error correction event and to provide a notification thereof. In this manner, a system or a user using the memory device of the present invention may monitor the error correction event notification to obtain information on the occurrence of error correction events and/or the memory locations of the bit errors. Meanwhile, data read out from the memory device continues with the error checking and correction operation being performed transparent to the data read out process. The error correction event notification method of the present invention can be implemented in a memory device to give insight into the health of the memory device and enabling preventive repair or replacement of the memory device or system in which it is used when needed.

In alternate embodiments of the present invention, a memory device incorporates a serial data bus coupled to the control circuit of the memory device to provide direct access to the error correction control circuit and to the error correction event notification information stored in mode registers of the control circuit. The error correction event notification information includes error correction event notification data and functions. The serial data bus enables access to the error correction control functions and to the error correction event notification information without requiring modifications to the memory controller used to control and communicate with the memory device.

In embodiments of the present invention, the memory device implements error correction code (ECC) as the error correction technique to recover from bit errors in the memory array. One example of an error correction code is the Hamming code, which appends a series of check bits to a data word as the data word is stored in the memory device. Upon a read operation, the retrieved check bits are compared to recalculated check bits to detect and correct bit errors in the read out data. Other error correction methods and techniques may be applied in the memory device in other embodiments. The use of the ECC error correction technique in the present description is illustrative only. Accordingly, in some embodiments, the error correction event notification method of the present invention is implemented in a memory device using ECC for error detection and correction where the memory array stores memory data and associated check bits for performing ECC operation. In the present description, an error correction event, also referred to as an "ECC event," occurs when an error is detected in the read out data from the memory array and the stored check bits are used to recover the correct read out data.

In some embodiments, the ECC event notification method is implemented in a monolithic memory device. A monolithic memory device refers to a standalone memory integrated circuit and may also be referred to as a memory integrated circuit or a memory chip. A monolithic memory device provides primarily data storage functions and is to be distinguished from an integrated circuit with an embedded memory formed thereon where the integrated circuit has primary functions other than for storing data. For example, a microprocessor integrated circuit with embedded memory is not a monolithic memory device in the present description. In the present description, memory devices include static random access memory (SRAM) devices, dynamic random access memory (DRAM) devices, synchronous DRAM (SDRAM) devices, FLASH memory devices, or other types of random access memory devices.

In a conventional memory device implementing ECC, the ECC operation is transparent to the system or the user. The system or the user of the memory device does not know which, if any, of the read out data has been error corrected. Transparent error correction operation in the memory read out process is intentional and is viewed as a benefit of the error correction technique in that errors in the memory read out data are automatically corrected without involvement or intervention from the external system or a user.

Increasingly, memory devices are being incorporated into safety systems or into systems where safety is a primary concern. For example, DRAM devices are being incorporated into automobile safety equipment or systems, such as machine vision camera system used for lane departure warning and blind spot detection, or automotive radar systems that are used for adaptive cruise control and collision avoidance systems. As memory devices with ECC are applied in these safety-critical applications, it may be necessary to know actually when an ECC event has occurred and/or when the read out data has been ECC corrected. For example, international standards, such as the ISO26262 standard, may require a system to have knowledge of an error correction event occurring in the system during the course of operation. The system may also need to know the location in the memory array where the error is occurring in order to determine if an error persists at the same location. In embodiments of the present invention, a memory device with ECC implements the error correction event notification method of the present invention to record the occurrence of an error correction event in the memory device. Additional information, such as the location of the error in the memory device, may also be recorded and stored in the memory device. The system or a user may monitor the ECC event notification to keep track of occurrences of ECC events. The system or user may further obtain information concerning the memory locations at which each ECC event occurs to determine if compensating action needs to be taken.

FIG. 1 is a block diagram of a memory device implementing the error correction event notification method in embodiments of the present invention. Referring to FIG. 1, a memory device 10 includes a memory array 12 for storing memory data. The memory device 10 includes an address/command input terminal 52 to receive an M-bit input address Addr to access a memory location in the memory array 12. The memory device 10 also receives commands on the address/command input terminal 52. The memory device 10 further includes a data terminal 54 being a P-bit input/output data terminal to receive input memory data and to provide output memory data (or read out data). Thus, the P-bit memory data DQ may be write data or read data depending on the operation mode of the memory device.

The memory device 10 in FIG. 1 is an example representation of a random access memory device, such as a DRAM device. The configuration of memory device 10 in FIG. 1 is illustrative only and is not intended to be limiting. The memory device 10 may include other elements or components not shown in FIG. 1 for simplicity reasons. Furthermore, the memory device 10 is a monolithic memory integrated circuit, or a standalone memory chip. The address/command input terminal 52 and the data terminal 54 are formed as multiple input or input-output pins on the integrated circuit. The memory integrated circuit may include other input and output terminals not shown in FIG. 1 for simplicity reasons. For example, the memory integrated circuit may include input-output pins for the power and ground connections and for control signals.

In some embodiments of the present invention, the memory device 10 is a low power double data rate synchronous DRAM, or LPDDR2 SDRAM. The LPDDR2 SDRAM implements the error correction event notification method of the present invention to enable the DRAM device to provide notification of an occurrence of an error correction event during data read out. In this manner, the LPDDR2 DRAM device can be implemented in systems requiring compliance with intentional standards, such as the ISO26262 standard, which require systems to be aware of the occurrence of an error correction event in a memory device incorporated therein.

Referring still to FIG. 1, the memory device 10 includes an address latch 16 to latch an input address Addr. The latched address is divided into a row address which is coupled to a row decoder 18 and a column address which is coupled to the column decoder 20. The row decoder decodes the row address and provides the decoded row address to the memory array 12 to activate an associated word line in the memory array. The column decoder decodes the column address and provides the decoded column address to an I/O gating circuit 24 to activate one or more bit lines in the memory array. In this manner, one or more memory cells associated with the activated word line and the activated bit lines are made available for either read, write or erase operation. In practice, the memory device activates the memory cells associated with all of the I/Os of the memory device. For example, the memory cells associated with one word of data or sixteen I/Os, may be activated for access based on the input address.

In the present illustration, the memory array 12 is organized as N+1 banks of memory cells, each bank storing K words of P-bit memory data. For example, the memory array 12 may be organized as 8 banks of 8Meg words of 16-bit memory data. FIG. 2 illustrates a memory bank n of the memory device 10 organized as K words of 16-bit memory data in one example. To implement ECC, the memory array 12 of the memory device 10 includes a main memory array 13 for storing memory data and an ECC memory array 14 for storing ECC check bits.

The memory device 10 further includes a sense amplifier 22 to facilitate read out of stored memory data, including the ECC check bits. The sense amplifier 22 may include a bank of sense amplifier circuits for a set of I/Os. Memory data read out of the main memory array 13 is stored in read registers 26 while the corresponding ECC check bits read out of the ECC memory array 14 are provided to an ECC decoder 28 for processing. The read out data from the read registers 26 and the processed ECC check bits from ECC decoder 28 are provided to an ECC logic circuit 30 to perform error checking and correction. In particular, the ECC logic circuit 30 calculates check bits from the read out data and compares the calculated check bits with the processed check bits read from the ECC memory array 14 to detect and correct bit errors in the read out data. The read out data, which may or may not be error corrected, is then provided to a data output circuit 32 which provides the read out data as the output data DQ on the data terminal 54. The data output circuit 32 may provide buffering or clocking functions.

To write data into the memory device 10, the memory device 10 further includes write drivers 34 configured to receive input memory data DQ on data terminal 54. The write drivers 34 may include a bank of write driver circuits for a set of I/Os. The write data from the write drivers 34 is coupled through sense amplifier 22 to be written into the main memory array 12. Meanwhile, the write data is also provided to an ECC check bit generation circuit 36 (or "ECC check bit generator") to generate the ECC check bits for the write data. The ECC check bits are then stored in the ECC memory array 14.

The memory device 10 includes a control circuit 40 to control the operation of the memory device. In some configurations, commands for the memory device 10 are also received on the address/command input terminal 52 and such operational commands are provided to the control circuit 40. Control circuit 40 is in communication with the various circuit elements in memory device 10 to control the memory device in response to the received commands, such as to read data, to write data, or to configure the memory device. The control circuit includes mode registers 45 used to store configuration information for the memory device. Mode registers 45 are sometimes referred to as "control registers" and are used to store values for controlling various operational functions and features of the memory device, such as how the memory device should be addressed and the functions of the input/output pins of the memory device.

In embodiments of the present invention, the error correction event notification method is implemented in the memory device 10 using the reserved or unused mode register cells in the mode registers 45 for error correction event notification. In this manner, error correction event notification can be provided using existing circuit elements in the memory device, without requiring modification of or addition to the memory device circuitry. In the present description, mode registers or mode register cells used for error correction event notification are referred to as "ECC event registers."

FIG. 3 illustrates mode register assignments for a set of mode registers which can be incorporated into the memory device of FIG. 1 to implement the error correction event notification method in embodiments of the present invention. In the present example, the mode register assignments are illustrated for a LPDDR2 DRAM and are extended from the JEDEC standard. The mode register assignments in FIG. 3 are illustrative only and are not intended to be limiting. The error correction event notification method can be applied in other memory devices having other mode register assignment configuration.

Referring to FIG. 3, the set of mode registers 100 includes mode registers 0 to 15 with each mode register include eight mode register cells OP0 to OP7. Mode registers 100 store values which are used to configure various operational features of the memory device, such as the operational mode of the memory device and/or the functions of one or more pins of the memory device. In the present example, mode register MR0 is assigned to store device information and mode register cells OP0 and OP1 are assigned to hold device information values DAI and DI. The remaining mode register cells are left unused or reserved. In another example, mode register MR1 is assigned to store device feature set 1 and all of the mode register cells OP0 to OP7 are assigned to feature configuration values. Under any given standard, the mode registers will include a number of unused or reserved mode registers or mode registers cells. For example, mode registers MR11 to MR15 are reserved and not used. In the present illustration, the unused or reserved register cells are illustrated as shaded.

In embodiments of the present invention, the error correction event notification method makes use of the unused or reserved mode register cells to store error correction related information. In this manner, the error correction event notification method can control the operation state of the event notification method, including initializing states, monitoring error correction events, recording events and resetting states. The error correction event notification method can further make use of the unused or reserved mode register cells to assign an external pin of the memory device for error correction event notification.

In the embodiment shown in FIG. 3, the mode registers 100 includes mode register cells that are configured for ECC event notification. Specifically, mode register cell OP7 in mode register MR0 is assigned to provide an error correction event (or "ECC Event") notification. The ECC Event mode register cell is a read only cell for external systems. The ECC Event mode register cell has a first value (e.g., "0") to indicate no error correction event has occurred and a second value (e.g., "1") to indicate an error correction event has occurred. In embodiments of the present invention, the ECC logic circuit 30 (FIG. 1) asserts the ECC event signal which is coupled to the mode registers. When an ECC event is detected, the ECC event signal will be asserted to write the ECC Event mode register cell to the second value ("1"). In this manner, a system using the memory device, through its firmware, may monitor the ECC Event mode register cell for the occurrence of an error correction event. In particular, the system may use standard register access method to read the value of the ECC Event mode register cell.

The mode registers 100 further make use of the reserved mode registers MR11 to MR15 to provide information related to an error correction event. In one embodiment, mode register cell OP1 in mode register MR11 is assigned a value "PIN" which is used to assign a pin or input/output terminal of the memory device as the ECC event notification pin. The PIN mode register cell is a write only cell by external systems. The PIN mode register cell is written to a first value (e.g., "0") to indicate no external pin is used for event notification and is written to a second value (e.g., "1") to indicate the ECC event notification should be provided to an external pin of the memory device. The system, through its firmware, may write to the PIN mode register cell if ECC event notification on an external pin is desired. The memory device may designate a pin for use as an ECC event notification and may make use of previously unused or no-connect pin. For example, as shown in FIG. 1, an ECC terminal 56 (FIG. 1) is designated as the ECC event notification pin ("ECC pin"). When the PIN mode register cell has been written to the second value ("1") by an external system, the ECC pin will be asserted in response to the ECC event signal being asserted. In the example shown in FIG. 1, the ECC logic circuit 30 controls the ECC pin 56 to provide the ECC event notification. In other embodiments, the ECC pin 56 may be controlled indirectly by the ECC logic circuit. There may be intervening circuitry between the ECC logic circuit 30 and the ECC pin 56. Furthermore, in some embodiments, the ECC pin may be initialized to a first state (e.g., 0V) and may be asserted to a second state (e.g., 5V) in response to the ECC event signal generated by the ECC logic circuit 30.

In this manner, a system or a user can use standard register access to read the ECC Event mode register to monitor for ECC events. Alternately, the system or user can write to the PIN mode register cell and use the designated ECC pin to monitor the ECC notification. This allows for external hardware to recognize the event and allows for external processors to create Interrupt routines for external events instead of monitoring them in DRAM operations registers.

In one embodiment, mode register MR12 is used to store the values indicating the memory bank in which the ECC event occurred. In the present embodiment, mode register cells OP0 to OP7 are used to indicate which of the 8 memory banks is associated with the ECC event. The Memory Bank ID mode register cells are read only cells for external systems. Each of the Memory Bank ID mode register cells has a first value (e.g., "0") to indicate no error correction event in that bank and a second value (e.g., "1") to indicate an error correction event has occurred in that bank. In embodiments of the present invention, in response to the ECC logic circuit 30 (FIG. 1) providing the ECC event signal, the Memory Bank ID mode register cell associated with the memory bank ID of the current address being accessed is written to the second value ("1"). In this manner, a system using the memory device, through its firmware, may use standard register access method to read the value of the Memory bank ID mode register cells to determine the memory bank in which an error correction event has occurred.

In one embodiment, mode registers MR13 and MR14 are used to store the address values indicating the memory address location in which the ECC event occurred. In the present embodiment, the memory array is assumed to be organized in 8 banks of 16-bit words. Accordingly, the mode register MR13 stores the upper 8-bit of the memory address (ADDR-H) while the mode register MR14 stores the lower 8-bit of the memory address (ADDR-L). In this manner, a system using the memory device, through its firmware, may use standard register access method to read the value of the ADDR-H and ADDR-L mode register cells to determine the memory address location in which an error correction event has occurred.

In one embodiment, mode register cell OP0 in mode register MR11 ("CLR ECC") is used to clear the ECC event notification. The CLR ECC mode register cell is a write only cell by the external system. The CLR ECC mode register cell is written to a first value (e.g., "0") for no action taken and is written to a second value (e.g., "1") to reset or clear the ECC event registers, such as to set the ECC Event mode register cell to the reset value ("0") and to reset the ECC pin. Furthermore, the Memory Bank ID cells, the ADDR-H and ADDR-L mode register cells are also reset to their initial state or to null value when cleared by the CLR ECC mode register cell. An external system can use standard register access to write to the CLR ECC mode register cell to clear the ECC event registers and also to reset the ECC pin.

In operation, the error correction event notification method responds to the occurrence of an error correction event by setting the ECC Event mode register cell or providing ECC event notification on the ECC pin, or by recording the memory bank ID and the memory address. The external system may then monitor the ECC event mode register cell, or monitor the ECC pin for the occurrence of an error correction event. The external system can collect ECC event data over time to determine if the same memory address or the same memory bank is experiencing repeated ECC correction which can indicate a serious enough problem with the memory device. The external system may then generate an alert to service the system.

In some embodiments of the present invention, the memory device 10 is implemented with an ECC control function to enable the ECC function to be turned on or off. Referring back to FIG. 1, the control circuit 40 is configured to control the ECC decoder 28 and the ECC check bit generator 36 through a control bus 38. The control circuit 40, in response to commands received on the input terminal 52, provides the control signal to turn the ECC function on and off, that is, to enable or disable the ECC function. In other words, the control circuit 40 can be configured to enable or disable the ECC decoder 28 and the ECC check bit generator 36. In some embodiments, the mode registers 45, besides storing error correction event notification information, the mode registers may also be configured to store error correction configuration information. For example, the control circuit 40 includes a mode register cell in the mode registers 45 to store configuration information for the ECC on/off function. For example, referring to FIG. 3, mode register 100 may be configured to include a mode register cell for controlling the on and off status of the ECC function. Specifically, in the present example, mode register cell OP7 in mode register MR11 is assigned to provide an error correction function on and off status (ECC On/Off). The ECC On/Off mode register cell has a first value (e.g., "0") to indicate that the error correction function is disabled and a second value (e.g., "1") to indicate that the error correction function is enabled. In particular, an external system may use standard register access method to write the value of the ECC On/Off mode register cell to control the enable or disable status of the ECC function. The control circuit 40, in response to the value of the ECC On/Off mode register cell, controls the ECC decoder 28 and the ECC check bit generator 36 through a control bus 38 to turn the ECC function on or off.

Figure 4:
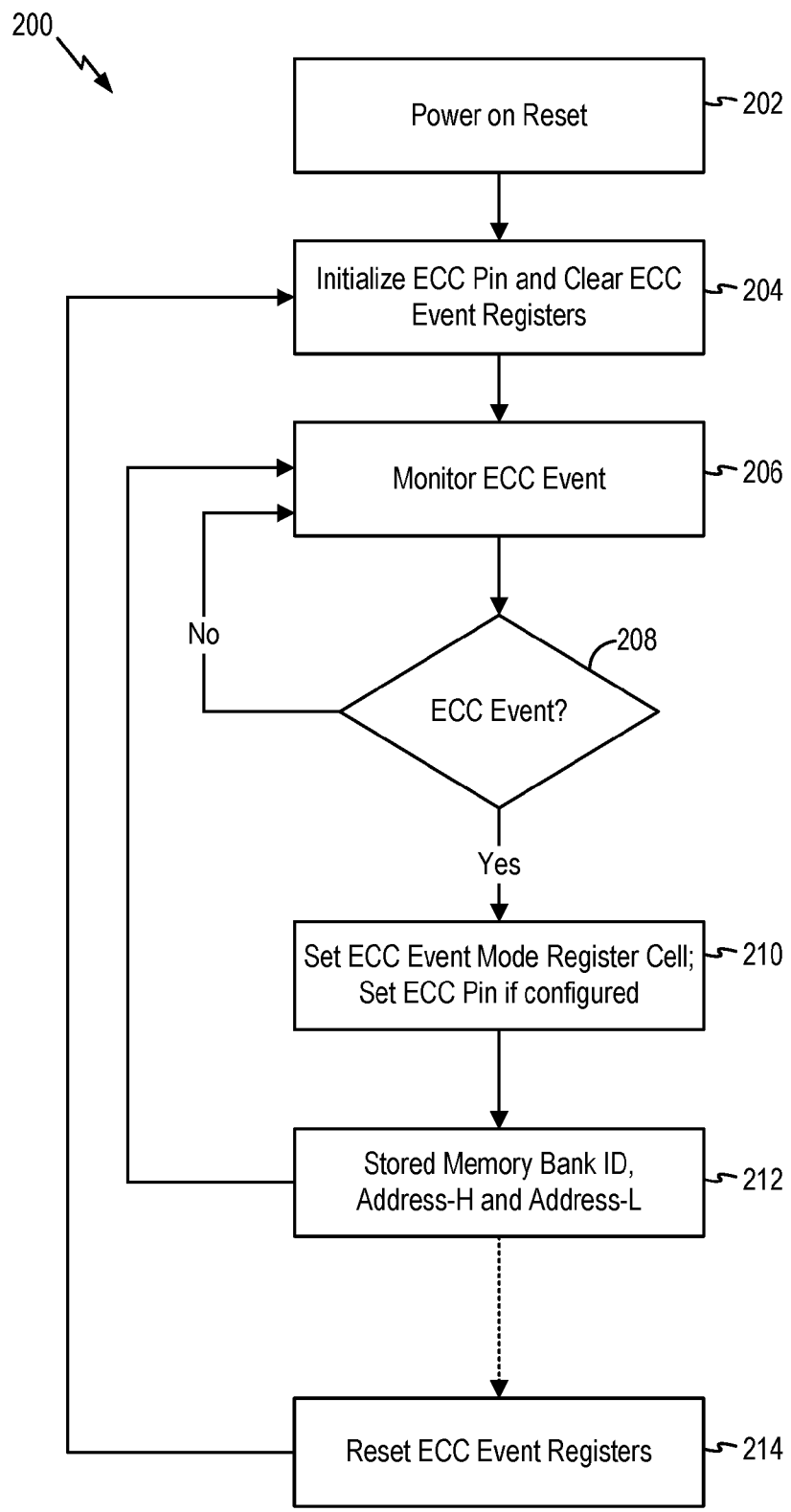
FIG. 4 is a flowchart illustrating the error correction event notification method in a memory device implemented with error correction in embodiments of the present invention.

FIG. 4 is a flowchart illustrating the error correction event notification method in a memory device implemented with error correction in embodiments of the present invention. Referring to FIG. 4, in response to a power on reset event at the memory device (202), the error correction event notification method 200 initializes the ECC pin, if used, and clears the ECC event registers (204). For example, the ECC pin is set to a reset state indicating no ECC event and the ECC Event mode register cell (FIG. 3) is set to the first state ("0"). Then, the method 200 monitors for the occurrence of ECC events during memory operation (206), such as during memory read operations. For example, the method 200 monitors the ECC event signal from the ECC logic circuit (FIG. 1) for the occurrence of an ECC event. The method 200 determines if an ECC event has occurred (208). When no ECC event is reported, the method 200 repeats at 206 to continue to monitor for ECC event occurrence during memory operation.

When an ECC event has occurred, such as indicated by the ECC event signal being asserted by the ECC logic circuit, the method 200 then set the ECC Event mode register cell to the second state ("1") indicating the occurrence of an ECC event (210). If an ECC pin has been configured by the PIN mode register cell, the method 200 also set the ECC pin to an asserted state to indicate the occurrence of an ECC event. Next, the method 200 stores the memory bank ID and the memory address location into the respective mode registers (212). For example, the memory bank ID is stored in the respective Memory Bank ID mode register cell, the upper p-bit of the memory address is stored in the ADDR-H mode register cells and the lower p-bit of the memory address is stored in the ADDR-L mode register cells.

After recording an ECC event, the method 200 continues at 206 to monitor ECC events during memory operation. Subsequent ECC events will be recorded in the mode register cells by overwriting of previous data. In some cases, the external system may want to reset the values of the error correction event registers. In that case, the external system may write to the CLR ECC mode register cell to clear or reset the values of the ECC event registers (214). When the CLR ECC mode register cell is written to the second state ("1"), the method 200 returns to 204 where the ECC pin, if used, and the ECC event registers are cleared. That is, the ECC Event mode register cell, the Memory Bank ID cells, the ADDR-H cells, and the ADDR-L cells are all reset to their initial states ("0") or null value, and the ECC pin is initialized. The method 200 then continues with monitoring the ECC event 206.

ECC Event Notification Using a Serial Data Bus

In the above described system and method, unused or reserved mode register cells of the control circuit are used to implement error correction event notification and also to store error correction event data, such as the memory bank ID and the memory address location where the error correction event has occurred. An external system, such as a memory controller, coupled to control and communicate with the memory device, may access the designated mode register cells, such as the "ECC event" mode register cell, to obtain the error correction event notification information.

However, conventional memory controllers are often designed to access mode registers that are assigned for control operations and functions under the industry standard specification. The conventional memory controllers are typically not provided with means to access the unused or reserved mode registers or mode register cells as these mode registers or mode register cells are not used under the industry standard specification. Therefore, the conventional memory controllers may have to be modified in order to enable access to these unused or reserved mode register cells to obtain the error correction event notification information. In some cases, modifications to memory controllers are not feasible or practical.

In embodiments of the present invention, a memory device, implementing the error correction event notification method described above, incorporates a serial data bus coupled to the control circuit of the memory device to provide direct access to the error correction event notification information generated by the error correction event notification method and stored in mode registers of the control circuit. Furthermore, the memory device uses the serial data bus to control the ECC functions, such as to turn the ECC function on and off in the memory device. The ECC functions may be controlled by accessing an ECC control circuit in the control circuit of the memory device through the serial data bus. The serial data bus is provided as an external interface to the memory device to enable an external system to communicate with the control circuit on the serial data bus to control or access the ECC functions of the memory device through the use of a serial data interface protocol. In this manner, the serial data bus enables an external system, such as microprocessor, to directly access and control the error correction event notification data and functions that are stored in mode registers of the control circuit, without requiring any modification to the memory controller itself. For example, an external system, or a memory controller, may use a serial data interface client to communicate with the memory device on the serial data bus to access and control the error correction event notification information.

In some embodiments, the ECC control circuit and the associated ECC functions may be accessed by both the serial data bus and the parallel interface bus for the address and command signals. In particular, a memory device includes a parallel interface bus coupled to the control circuit to provide the address and command signals. This standard parallel interface bus can be used in addition to the serial data bus of the present invention to access the ECC control circuit and functions. In this manner, flexibility in access to the ECC control circuit is ensured.

In the present description, error correction event notification information refers to both the error correction event notification data, such as the ECC event indicator, the memory bank ID and the memory location address, and the error correction event notification control functions, such as the ECC Pin assignment and clearing or resetting of the values of the ECC event registers.

In some embodiments, the error correction event notification information are stored in unused or reserved mode registers of the control circuit where the other mode registers of the control circuit are used to store control data for the control operation of the memory device, including control data for configuring operational functions and features of the memory device. In other embodiments, the error correction event notification information is stored in mode registers that are specifically designated for the error correction event notification information.

In embodiments of the present invention, the memory device is provided with the serial data bus which is used to configure the error correction event notification function, such as to set the ECC Pin, and also to retrieve the error correction event notification data, such as the address location of the ECC error. In some embodiments, the serial data bus is a synchronous serial communication interface formed as a multi-wire serial bus. In one example, the serial data bus may include a serial clock signal, a serial data input signal, and a serial data output signal. In other examples, the serial data bus may further include an enable signal to enable the serial data bus.

In some embodiments, the serial data bus incorporated in the memory device is a Serial Peripheral Interface (SPI) bus. The Serial Peripheral Interface (SPI) is a synchronous serial communication interface that provides full-duplex synchronous serial communication between master and slave devices. The SPI bus is a four-wire serial bus including four logic signals with signaling convention specified by the SPI specification. In particular, the logic signals of the SPI bus includes: a serial clock (SCLK), a Master Output/Slave Input (or Serial Data Input SDI), a Master Input/Slave Output (or Serial Data Output SDO), and a Slave Select (or Enable EN).

In other embodiments, the serial data bus incorporated in the memory device is an I$^2$C (Inter-Integrated Circuit) bus. The I$^2$C is a multi-master, multi-slave, single-ended, serial computer bus. The I$^2$C is typically used for attaching lower-speed peripheral integrated circuits to processors and microcontrollers in short-distance, intra-board communication. The I$^2$C bus is sometimes referred to as I2C or IIC bus. The I$^2$C bus includes two wires called SCL and SDA. The SCL wire is the clock line used to synchronize data transfers over the I$^2$C bus. The SDA wire is the data line.

In embodiments of the present invention, the serial data bus is coupled to the control circuit of the memory device to provide direct access to the error correction event notification information. It is instructive to note that there are conventional memory devices with serial data interfaces used for memory data input and output or address/command input and output. In these conventional memory devices, the serial data bus is used for memory data or for the address and command used to access memory data. In embodiments of the present invention, a serial data bus is added to a memory device and configured for use in control functions only. The use of a serial data bus for control functions of a memory device has not been previously described.

Figure 5:
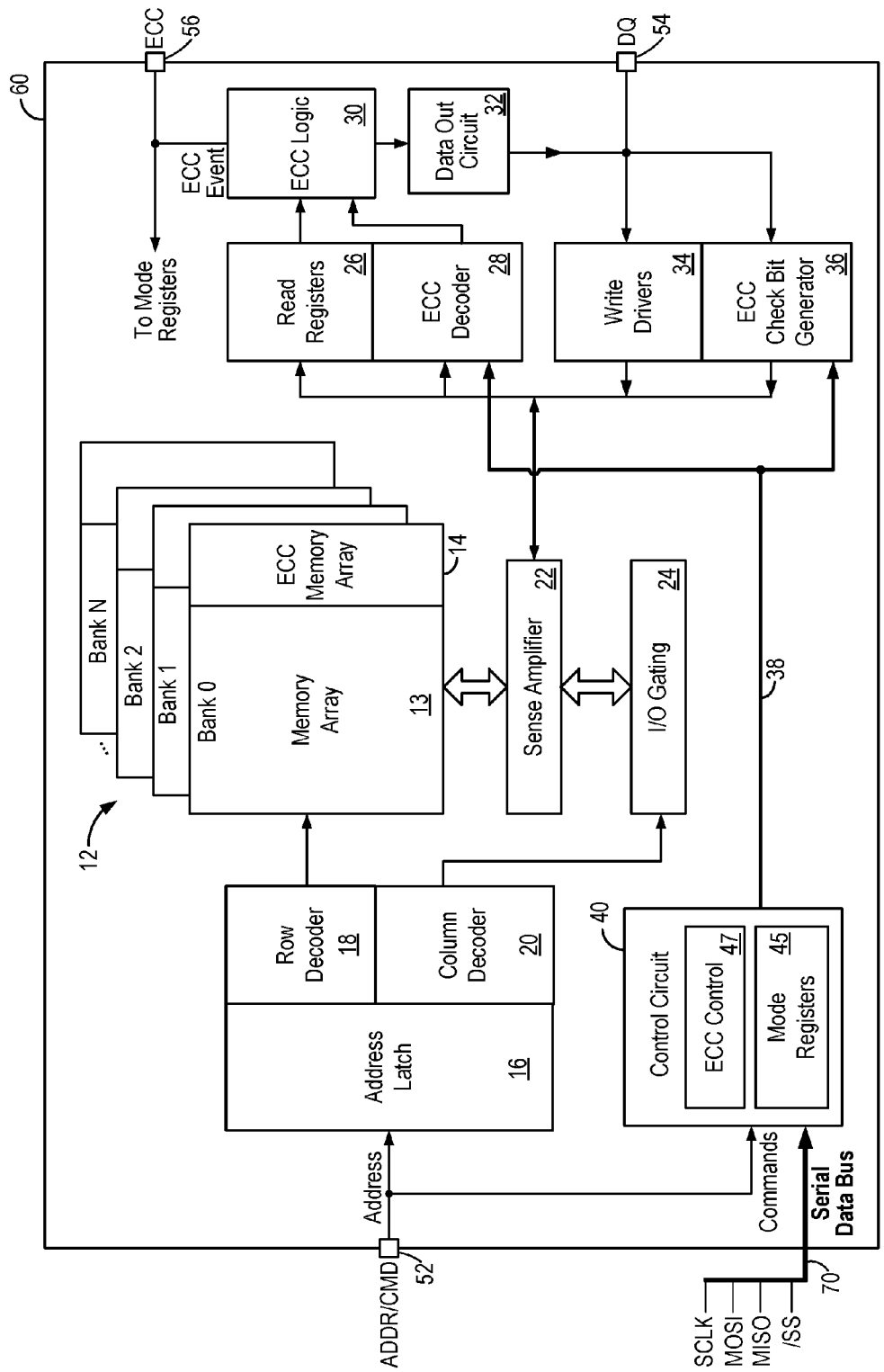
FIG. 5 is a block diagram of a memory device implementing an error correction event notification method using a serial data bus interface in an alternate embodiment of the present invention.

In some embodiments, a memory device, such as a DRAM, includes a parallel data bus for memory data and address/command and a serial data bus for error correction event notification information. FIG. 5 is a block diagram of a memory device implementing an error correction event notification method using a serial data bus interface in an alternate embodiment of the present invention. Referring to FIG. 5, a memory device 60 includes a memory array 12 for storing memory data. The memory device 60 includes an address/command input terminal 52 to receive an M-bit input address Addr to access a memory location in the memory array 12. The memory device 60 also receives commands on the address/command input terminal 52. The memory device 60 further includes a data terminal 54 being a P-bit input/output data terminal to receive input memory data and to provide output memory data (or read out data). Thus, the P-bit memory data DQ may be write data or read data depending on the operation mode of the memory device. In the present embodiment, the address/command input terminal 52 and the data terminal 54 are both configured as parallel data buses. The M-bit input address Addr or commands are received on an M-bit parallel data bus as the address/command input terminal 52. Meanwhile, the P-bit memory read data or the P-bit memory write data are received or provided on a P-bit parallel data bus as the data terminal 54.

The memory device 60 in FIG. 5 is an example representation of a random access memory device, such as a DRAM device. The configuration of memory device 60 in FIG. 5 is illustrative only and is not intended to be limiting. The memory device 60 may include other elements or components not shown in FIG. 5 for simplicity reasons. Furthermore, the memory device 60 is a monolithic memory integrated circuit, or a standalone memory chip. The address/command input terminal 52 and the data terminal 54 are formed as multiple input or input-output pins on the integrated circuit. The memory integrated circuit may include other input and output terminals not shown in FIG. 5 for simplicity reasons. For example, the memory integrated circuit may include input-output pins for the power and ground connections and for control signals.

In some embodiments of the present invention, the memory device 60 is a low power double data rate synchronous DRAM, or LPDDR2 SDRAM. The LPDDR2 SDRAM implements the error correction event notification method described above to enable the DRAM device to provide notification of an occurrence of an error correction event during data read out. In this manner, the LPDDR2 DRAM device can be implemented in systems requiring compliance with intentional standards, such as the ISO26262 standard, which require systems to be aware of the occurrence of an error correction event in a memory device incorporated therein.

Referring still to FIG. 5, the memory device 60 includes an address latch 16 to latch an input address Addr. The latched address is divided into a row address which is coupled to a row decoder 18 and a column address which is coupled to the column decoder 20. The row decoder decodes the row address and provides the decoded row address to the memory array 12 to activate an associated word line in the memory array. The column decoder decodes the column address and provides the decoder column address to an I/O gating circuit 24 to activate one or more bit lines in the memory array. In this manner, one or more memory cells associated with the activated word line and the activated bit lines are made available for either read, write or erase operation. In practice, the memory device activates the memory cells associated with all of the I/Os of the memory device. For example, the memory cells associated with one word of data or sixteen I/Os, may be activated for access based on the input address.

In the present illustration, the memory array 12 is organized as N-1 banks of memory cells, each bank storing K words of P-bit memory data. For example, the memory array 12 may be organized as 8 banks of 8 Meg words of 16-bit memory data. FIG. 2 described above illustrates an example of a memory bank n of the memory device 60. To implement ECC, the memory array 12 of the memory device 60 includes a main memory array 13 for storing memory data and an ECC memory array 14 for storing ECC check bits.

The memory device 60 further includes a sense amplifier 22 to facilitate read out of stored memory data, including the ECC check bits. The sense amplifier 22 may include a bank of sense amplifier circuits for a set of I/Os. Memory data read out of the main memory array 13 is stored in read registers 26 while the corresponding ECC check bits read out of the ECC memory array 14 are provided to an ECC decoder 28 for processing. The read out data from the read registers 26 and the processed ECC check bits from ECC decoder 28 are provided to an ECC logic circuit 30 to perform error checking and correction. In particular, the ECC logic circuit 30 calculates check bits from the read out data and compares the calculated check bits with the processed check bits read from the ECC memory array 14 to detect and correct bit errors in the read out data. The read out data, which may or may not be error corrected, is then provided to a data output circuit 32 which provides the read out data as the output data DQ on the data terminal 54. The data output circuit 32 may provide buffering or clocking functions. In some embodiments, the ECC logic circuit 30 determines if an error correction event has occurred. In some examples, the ECC logic circuit 30 may use Hamming Code logic and the ECC logic circuit would determine if the data was corrected by the Hamming Code or not.

To write data into the memory device 60, the memory device 60 further includes write drivers 34 configured to receive input memory data DQ on data terminal 54. The write drivers 34 may include a bank of write driver circuits for a set of I/Os. The write data from the write drivers 34 is coupled through sense amplifier 22 to be written into the main memory array 12. Meanwhile, the write data is also provided to an ECC check bit generation circuit 36 (or "ECC check bit generator") to generate the ECC check bits for the data being written into the memory array 13. The corresponding ECC check bits are then stored in the ECC memory array 14. In some embodiments, the ECC check bit generation circuit 36 may use a Hamming Code as the error correction code.

The memory device 60 includes a control circuit 40 to control the operation of the memory device. In some configurations, commands for the memory device 60 are also received on the address/command input terminal 52 and such operational commands are provided to the control circuit 40. Control circuit 40 is in communication with the various circuit elements in memory device 60 to control the memory device in response to the received commands, such as to read data, to write data, or to configure the memory device. The control circuit 40 includes an error correction control circuit 47 (or "ECC control circuit") used to control or configure the ECC functions of the memory device 60 via the Serial Data Bus 70. For example, the ECC control circuit 47 may be used to turn the ECC function of the memory device 60 on and off, or to turn on or off the external ECC pin 56, and various other functions. The ECC control circuit 47 may also be used to read the ECC status, the memory location of ECC Events, and to clear the ECC event status. The control circuit includes mode registers 45 used to store configuration information for the memory device. Mode registers 45 are sometimes referred to as "control registers" and are used to store values for controlling various operational functions and features of the memory device, such as how the memory device should be addressed and the functions of the input/output pins of the memory device.

In some embodiments, the control circuit 40 is configured to control the ECC decoder 28 and the ECC check bit generator 36 through a control bus 38. In one example, ECC control circuit 47 in the control circuit 40, in response to commands received on the input terminal 52 or ECC configuration information stored in the mode register cells, generates the control signal to turn the ECC function on and off, that is, to enable or disable the ECC function. In other words, the control circuit 40 can be configured to enable or disable the ECC decoder 28 and the ECC check bit generator 36.

In embodiments of the present invention, the error correction event notification method is implemented in the memory device 60 using the reserved or unused mode register cells in the mode registers 45 for error correction event notification and for error correction function configuration information. In this manner, error correction event notification can be provided using existing circuit elements in the memory device, without requiring modification of or addition to the memory device circuitry. In the present description, mode registers or mode register cells used for error correction event notification are referred to as "ECC event registers." FIG. 3 above describes one example of the mode register assignment which can be used to incorporate the ECC event registers in the mode registers of the control circuit 40. In some embodiments, the ECC event registers include an ECC On/Off mode register cell which is used to configure the ECC function by enabling or disabling the ECC function. The ECC event registers may further include a PIN mode register cell which is used to assign a pin or input/output terminal of the memory device as the ECC event notification pin. As described above, the memory device 60 may designate a pin, such as ECC pin 56, for use as an ECC event notification and may make use of previously unused or no-connect pin. In the present embodiment, the ECC logic circuit 30 controls the ECC pin 56 to provide the ECC event notification. In other embodiments, the ECC pin 56 may be controlled indirectly by the ECC logic circuit. There may be intervening circuitry between the ECC logic circuit 30 and the ECC pin 56. Furthermore, in some embodiments, the ECC pin 56 may be initialized to a first state (e.g., 0V) and may be asserted to a second state (e.g., 5V) in response to the ECC event signal generated by the ECC logic circuit 30.

In the above described embodiments, the ECC event registers are implemented in the unused or reserved mode register cells of the control registers of the control circuit. In this manner, the error correction event notification method can be implemented in legacy memory devices without requiring modification to the memory device circuitry. In other embodiments, the memory device may be configured with additional registers that are specifically designated for use as the ECC event registers. The error correction event notification method of the present invention may be applied to memory devices that are provided only with control registers where the unused or reserved mode registers are designated as ECC event registers. Alternately, the error correction event notification method of the present invention may be applied to memory devices that are provided with additional special purpose registers in addition to the control registers where the special purpose registers are designated for ECC event notification. Regardless of the mode register configuration, the error correction event notification method of the present invention enables access to the mode register cells through the use of a serial data bus 70.

Accordingly, in the present embodiment, the memory device 60 includes a serial data bus 70 configured to interface or communicate with the control circuit 40. In one embodiment, the serial data bus 70 is a Serial Peripheral Interface (SPI) bus. The SPI bus 70 is a four-wire bus carrying four logic signals: SCLK as the serial clock, MOSI as the serial data input, MISO as the serial data output, and/SS as the serial bus enable signal. The SPI bus 70 may be controlled under the signaling convention of the SPI specification. An external system may access the error correction event notification information stored in the mode registers 45 of the control circuit 40 through the use of the serial data bus 70. In particular, an external system may use the serial data bus 70 to clear or reset the ECC event registers. The external system may use the serial data bus 70 to access the ECC event registers to retrieve the values stored in the ECC event registers, such as the ECC Event indicator, or the memory bank ID or the memory address stored therein. Finally, the external system may use the serial data bus 70 to control the ECC functions of the memory device through the ECC control circuit 47, such as to turn the ECC function of the memory device on and off. The ability to control the ECC functions of the memory device is particularly useful to meet the requirements of industrial standards requiring testing of the functionality of the ECC circuitry in the memory device, as will be explained in more detail below.

During the memory operation of the memory device 60, the error correction event notification method may respond to the occurrence of an error correction event by setting the ECC Event mode register cell or providing ECC event notification on the ECC pin, and by recording the memory bank ID and the memory address in the designated mode register cells. An external system may monitor the ECC Event mode register cell or monitor the ECC pin for the occurrence of an error correction event. In particular, the external system may access the ECC event registers through the serial data bus 70 to access the ECC Event mode register cell and the mode register cells storing the memory bank ID and the memory address.

Figure 6:
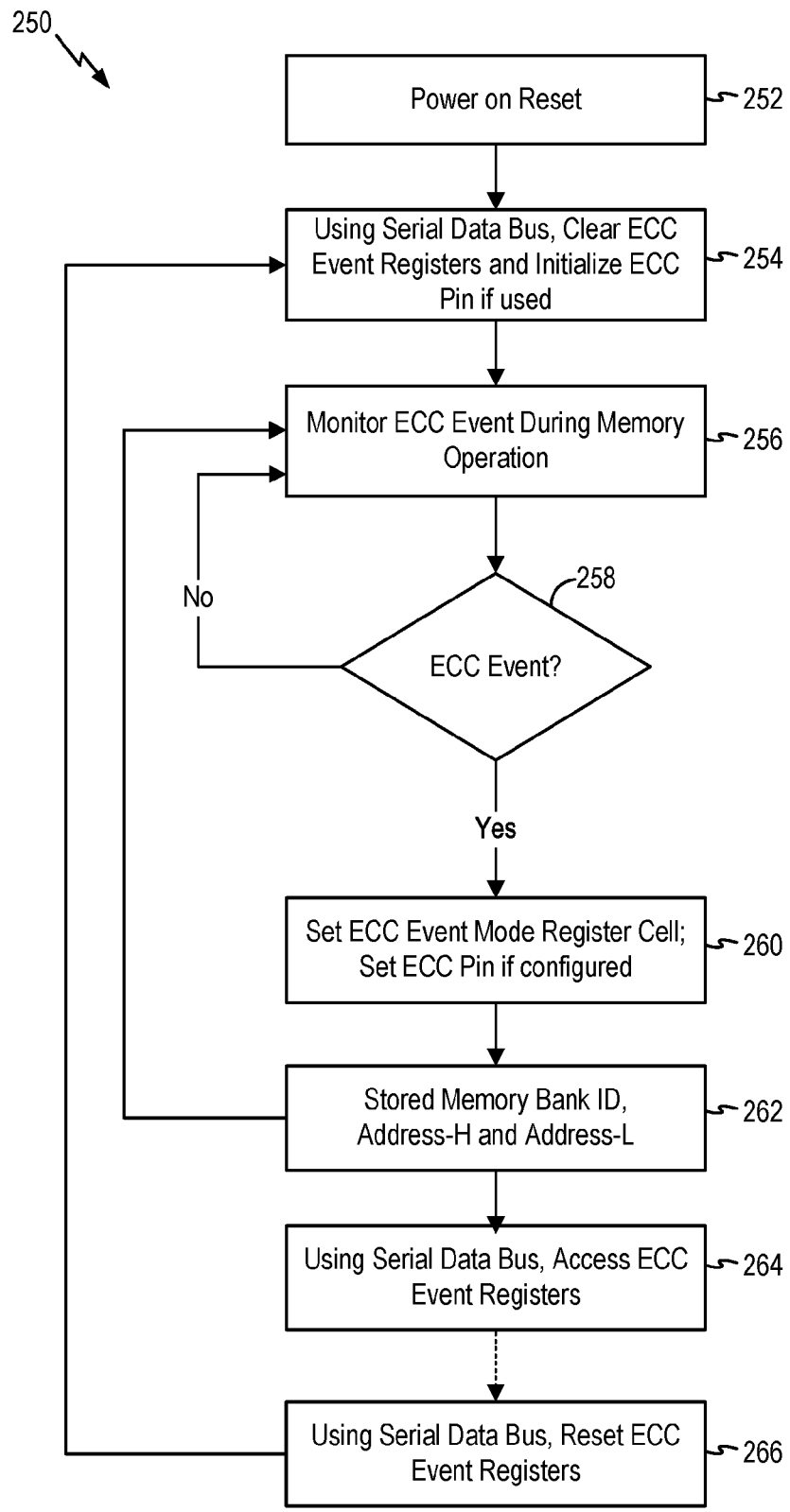
FIG. 6 is a flowchart illustrating the error correction event notification method using a serial bus interface in a memory device implemented with error correction in an alternate embodiment of the present invention.

FIG. 6 is a flowchart illustrating the error correction event notification method using a serial bus interface in a memory device implemented with error correction in an alternate embodiment of the present invention. Referring to FIG. 6, in response to a power on reset event at the memory device (252), the error correction event notification method 250 clears the ECC event registers by using the serial data bus to access the ECC event registers (254). In some embodiments, the method 250 also initializes the ECC pin using the serial data bus. For example, the ECC pin, if used, is set to a reset state indicating no ECC event and the ECC Event mode register cell (FIG. 3) is set to the first state ("0"). Furthermore, the Memory Bank ID cells, the ADDR-H cells, and the ADDR-L cells are reset to their initial states ("0") or null value. Then, the method 250 monitors for the occurrence of ECC events during memory operation (256). For example, the method 250 monitors for the occurrence of ECC events during memory read operations. In one embodiment, the method 250 monitors the ECC event signal from the ECC logic circuit (FIG. 1) for the occurrence of an ECC event. The method 250 determines if an ECC event has occurred (258). When no ECC event is reported, the method 250 repeats at 256 to continue to monitor for ECC event occurrence during the memory operation.

When an ECC event has occurred, such as indicated by the ECC event signal being asserted by the ECC logic circuit, the method 250 then set the ECC Event mode register cell to the second state ("1") indicating the occurrence of an ECC event (260). If an ECC pin has been configured by the PIN mode register cell, the method 250 also set the ECC pin to an asserted state to indicate the occurrence of an ECC event. Next, the method 250 stores the memory bank ID and the memory address location into the respective mode registers (262). For example, the memory bank ID is stored in the respective Memory Bank ID mode register cell, the upper p-bit of the memory address is stored in the ADDR-H mode register cells and the lower p-bit of the memory address is stored in the ADDR-L mode register cells.

After recording an ECC event, the method 250 continues at 256 to monitor for ECC events during the memory operation. Subsequent ECC events will be recorded in the mode register cells by overwriting of previous data. With the error correction event notification information thus stored in the ECC event registers, the method 250 enables the ECC event registers to be accessed through the serial data bus (264).

In some cases, the external system may want to reset the values of the error correction event registers. In that case, the external system may, through the serial data bus, write to the CLR ECC mode register cell to clear or reset the values of the ECC event registers (266). When the CLR ECC mode register cell is written to the second state ("1"), the method 250 returns to 254 where the ECC pin, if used, and the ECC event registers are cleared. That is, the ECC Event mode register cell, the Memory Bank ID cells, the ADDR-H cells, and the ADDR-L cells are all reset to their initial states ("0") or null value, and the ECC pin, if used, is initialized. The method 250 then continues with monitoring the ECC event 256 during memory operation.

As described above, the error correction event notification method of the present invention may be implemented in a memory device using special purpose mode registers in the control circuit, instead of the unused or reserved mode register cells of the control registers. FIG. 7 illustrates mode register assignments for a set of mode registers which can be incorporated into the memory device of FIG. 5 to implement the error correction event notification method using a serial bus in embodiments of the present invention. Referring to FIG. 7, a set of mode registers 300 includes mode registers 0 to 7 with each mode register include eight mode register cells OP0 to OP7. Mode registers 300 are special purpose registers designated for use as the ECC event registers. Accordingly, the mode register cells may be assigned as needed to store error correction event notification information and error correction function configuration information.

In mode registers 300 as shown in FIG. 7, the mode register cell OP0 in mode register MR0 is assigned to provide an error correction event (or "ECC Event") notification. The ECC Event mode register cell is a read only cell for external systems. The ECC Event mode register cell has a first value (e.g., "0") to indicate no error correction event has occurred and a second value (e.g., "1") to indicate an error correction event has occurred. In embodiments of the present invention, the ECC logic circuit 30 (FIG. 5) asserts the ECC event signal which is coupled to the mode registers 300. When an ECC event is detected, the ECC event signal will be asserted to write the ECC Event mode register cell to the second value ("1"). In this manner, an external system using the memory device, through its firmware, may monitor the ECC Event mode register cell for the occurrence of an error correction event. In particular, the external system may use the serial data bus 70 (FIG. 5) to read the value of the ECC Event mode register cell.

In mode registers 300, mode register cell OP7 in mode register MR2 is assigned a value "PIN" which is used to assign a pin or input/output terminal of the memory device as the ECC event notification pin. The PIN mode register cell is a write only cell by external systems. The PIN mode register cell is written to a first value (e.g., "0") to indicate no external pin is used for event notification and is written to a second value (e.g., "1") to indicate the ECC event notification should be provided to an external pin of the memory device. The external system, through its firmware, may write to the PIN mode register cell if ECC event notification on an external pin is desired. For example, as shown in FIG. 5, an ECC terminal 56 is designated as the ECC event notification pin ("ECC pin"). When the PIN mode register cell has been written to the second value ("1") by an external system, the ECC pin will be asserted in response to the ECC event signal being asserted. In this manner, the system or user can write to the PIN mode register cell and use the designated ECC pin to monitor the ECC notification.

In one embodiment, mode register MR4 is used to store the values indicating the memory bank in which the ECC event occurred. In the present embodiment, mode register cells OP0 to OP7 in the mode register MR4 are used to indicate which of the 8 memory banks is associated with the ECC event. The Memory Bank ID mode register cells are read only cells for external systems. Each of the Memory Bank ID mode register cells has a first value (e.g., "0") to indicate no error correction event in that bank and a second value (e.g., "1") to indicate an error correction event has occurred in that bank. In embodiments of the present invention, in response to the ECC logic circuit 30 (FIG. 5) providing the ECC event signal, the Memory Bank ID mode register cell associated with the memory bank ID of the current address being accessed is written to the second value ("1"). In this manner, an external system using the memory device, through its firmware, may use the serial data bus 70 to read the value of the Memory bank ID mode register cells to determine the memory bank in which an error correction event has occurred.

In one embodiment, mode registers MR5 and MR6 are used to store the address values indicating the memory address location in which the ECC event occurred. In the present embodiment, the memory array is assumed to be organized in 8 banks of 16-bit words. Accordingly, the mode register MR5 stores the upper 8-bit of the memory address (ADDR-H) while the mode register MR6 stores the lower 8-bit of the memory address (ADDR-L). In this manner, an external system using the memory device, through its firmware, may use the serial data bus 70 to read the value of the ADDR-H and ADDR-L mode register cells to determine the memory address location in which an error correction event has occurred.

In one embodiment, mode register cell OP4 in mode register MR1 ("CLR ECC") is used to clear the ECC event notification. The CLR ECC mode register cell is a write only cell by the external system. The CLR ECC mode register cell is written to a first value (e.g., "0") for no action taken and is written to a second value (e.g., "1") to reset or clear the ECC event registers, such as to set the ECC Event mode register cell to the reset value ("0") and to reset the ECC pin. Furthermore, the Memory Bank ID cells, the ADDR-H and ADDR-L mode register cells are also reset to their initial state or to null value when cleared by the CLR ECC mode register cell. An external system can use the serial data bus 70 to write to the CLR ECC mode register cell to clear the ECC event registers and also to reset the ECC pin.

Finally, in one embodiment, mode register cell OP7 in mode register MR0 ("ECC On/Off") is used to enable or disable the ECC function. The ECC On/Off mode register cell is a write only cell by the external system. The ECC On/Off mode register cell has a first value (e.g., "0") to indicate that the error correction function is disabled and a second value (e.g., "1") to indicate that the error correction function is enabled. In particular, an external system may use the serial data bus to write the value of the ECC On/Off mode register cell to control the enable or disable status of the ECC function. The ECC control circuit 47 in the control circuit 40, in response to the value of the ECC On/Off mode register cell, controls the ECC decoder 28 and the ECC check bit generator 36 through the control bus 38 to turn the ECC function on or off.

As described above, under the ISO26262 standard, a memory device implementing ECC function must be provided with the ability to demonstrate that the ECC function works properly. The testing scheme for the ECC function requires the ability to turn the ECC function on and off in the memory device. In embodiments of the present invention, the testing scheme uses the ECC On/Off mode register cell to instruct the control circuit of the memory device to enable or disable the ECC function, as described above. For example, as shown in FIG. 5, the control circuit 40 may control the ECC decoder 28 and the ECC check bit generator 36 through a control bus 38 in response to the value of the ECC On/Off mode register cell to turn the decoder or check bit generator circuits on or off.

In some embodiments, a testing scheme for the ECC function in a memory device includes turning on the ECC function of the memory device and writing a first data pattern to pre-determined memory locations in the memory device with the ECC function enabled. Then, the testing scheme includes turning off the ECC function and writing a second data pattern to a subset of the pre-determined memory locations in the memory device with the ECC function disabled where the second data pattern is different from the first data pattern. Then, the testing scheme includes turning on the ECC function again and reading the pre-determined memory locations. The read result should include ECC errors in the subset of memory locations where different data values were written without generating the ECC check bits. In this manner, the testing scheme simulates the occurrence of data corruption event and enables the ECC function of the memory device to be verified as operational. For example, as a result of the testing scheme, an ECC event notification should thus be generated and the memory location of the ECC event should be recorded in the mode register cells.

In embodiments of the present invention, the serial data bus 70 provided to the memory device 60 facilitates the testing of the ECC function by enabling the ECC function to be turned on and off through accessing the ECC control circuit 47 in the control circuit 40 using the serial data bus 70. In some embodiment, the ECC On/Off mode register cell is written by the serial data bus 70 to configure the ECC function. Furthermore, the ECC event notification data stored in the mode registers 45 can be read through the serial data bus to verify the correct functionality of the ECC function in the memory device.

In embodiments of the present invention, the control circuit and the ECC control circuit of the memory device are constructed as digital or analog circuitry on a semiconductor substrate.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A memory device implementing error correction function during operation of the memory device, comprising:
a memory array comprising a first memory array configured to store memory data and a second memory array configured to store error correction check bits corresponding to the stored memory data;
a control circuit configured to control the operation of the memory device, the control circuit comprising a set of mode registers including an error correction event register storing a value indicating an occurrence of an error correction event and an error correction control circuit configured to control the error correction function of the memory device;

a serial data bus coupled to the control circuit to provide access to the error correction event register and to provide control of the error correction function at the error correction control circuit; and an error correction logic circuit configured to check and correct stored memory data retrieved from the memory array using the corresponding error correction check bits, wherein the memory device receives a command and a memory address to read out stored memory data from a memory location associated with the memory address in the first memory array during the operation of the memory device, the memory location in the first memory array is accessed in response to the command and the memory address and the stored memory data from the accessed memory location in the first memory array is retrieved with the error correction check bits corresponding to the accessed memory location, the error correction logic circuit being configured to check the retrieved memory data for bit errors using the retrieved check bits, the error correction logic circuit being configured to generate corrected memory data using the retrieved check bits and assert an error correction event signal in response to a bit error being detected in the retrieved memory data, the corrected memory data being provided as the read out memory data, and the error correction event register being set to a value in response to the error correction event signal being asserted to indicate that an error correction event has occurred in the read out data from the memory location associated with the memory address in the first memory array, and the error correction event register is accessed through the serial data bus to provide the indication of the error correction event.

2. The memory device of claim 1, wherein the serial data bus comprises a multi-wire synchronous serial communication interface bus.

3. The memory device of claim 1, wherein the memory device implements error correction code (ECC) and the error correction check bits comprise error correction code (ECC) check bits corresponding to the stored memory data.

4. The memory device of claim 1, wherein the error correction control circuit of the control circuit is configured to turn on and off the error correction function of the memory device, and wherein the error correction control circuit is accessed through the serial data bus to turn the error correction function of the memory device on and off.

5. The memory device of claim 4, wherein the set of mode registers includes a mode register cell designated as an error correction function on/off register storing a value indicating the error correction function to be turned on or off, and wherein the error correction control circuit is configured to control the error correction function of the memory device in response to the value of the error correction function on/off register.

6. The memory device of claim 5, wherein the error correction function on/off register is accessed through the serial data bus to write a first value indicating the error correction function is to be turned on and a second value indicating the error correction function is to be turned off.

7. The memory device of claim 1, wherein the memory device comprises a set of control registers as the set of mode registers, the control registers having one or more mode register cells configured to control operational functions of the memory device, and having one or more mode register cell designated as the error correction event register.

8. The memory device of claim 7, wherein the set of control registers includes unused or reserved mode register cells, a first unused or reserved mode register cell being designated as the error correction event register.

9. The memory device of claim 7, wherein the set of mode registers includes a clear event register, the clear event register being initialized to a first value, and wherein in response to the clear event register being set to a second value, the error correction event register is set to the a value indicating no error correction event has occurred.

10. The memory device of claim 7, wherein the set of mode registers includes a plurality of address registers, the memory address associated with the corrected memory data is stored in one or more of the address registers in response to the error correction event signal being asserted.

11. The memory device of claim 10, wherein the first memory array is organized in two or more memory banks and the memory address comprises an identification of the memory bank in the memory array and an address in the memory bank, the identification of the memory bank and the address in the memory bank associated with the corrected memory data are stored in the one or more address registers in response to the error correction event signal being asserted.

12. The memory device of claim 11, wherein the memory device comprises a set of control registers as the set of mode registers, the mode registers having one or more mode register cells configured to control operational functions of the memory device, and wherein one or more unused or reserved mode registers in the set of mode registers of the memory device are designated to store the identification of the memory bank and the address in the memory bank associated with the corrected memory data.

13. The memory device of claim 1, wherein the memory device further comprises a pin being assigned for error correction event notification, the pin being initialized to a first state, and wherein in response to the error correction event signal being asserted, the pin is asserted to a second state, and wherein in response to the error correction event signal being deasserted, the pin is deasserted to the first state.

14. The memory device of claim 13, wherein the memory device comprises a set of control registers as the set of mode registers, the mode registers having one or more mode register cells configured to control operational functions of the memory device, and wherein a mode register cell in the set of mode registers of the memory device is designated as a pin assignment register, the pin assignment register being initialized to a first value and being set to a second value to assign the pin of the memory device for error correction event notification.

15. A method in a memory device implementing error correction during operation of the memory device, the memory device including a first memory array configured to store memory data, a second memory array configured to store error correction check bits corresponding to the stored memory data, and a control circuit configured to control the operation of the memory device, the method comprising:

providing a set of mode registers in the control circuit, the set of mode registers including an error correction event register storing a value indicating an occurrence of an error correction event;

providing an error correction control circuit in the control circuit configured to control the error correction function of the memory device;

providing a serial data bus coupled to the control circuit to provide access to the error correction event register and to provide control of the error correction function at the error correction control circuit;

setting the error correction event register to a first value;

receiving a command and a memory address to read out stored memory data from a memory location associated with the memory address in the first memory array during the operation of the memory device;

accessing the memory location in the first memory array in response to the command and the memory address;

retrieving stored memory data from the accessed memory location in the first memory array and retrieving error correction check bits corresponding to the accessed memory location from the second memory array;

checking the retrieved memory data for bit errors using the retrieved check bits;

in response to a bit error being detected in the retrieved memory data, generating corrected memory data using the retrieved check bits and asserting an error correction event signal;

providing the corrected memory data as the read out memory data;

in response to the error correction event signal being asserted, setting the error correction event register to a second value to indicate an error correction event has occurred in the read out data from the memory location associated with the memory address in the first memory array; and accessing, using the serial data bus, the error correction event register to provide the indication of the error correction event.

16. The method of claim 15, wherein the serial data bus comprises a multi-wire synchronous serial communication interface bus.

17. The method of claim 15, further comprising:
assessing, using the serial data bus, the error correction control circuit to turn the error correction function of the memory device on and off.

18. The method of claim 17, further comprising:
providing an error correction function on/off register in the set of mode registers in the control circuit, the error correction function on/off register storing a value indicating the error correction function to be turned on or off; and in response to the value stored in the error correction function on/off register, turning on or off, using the error correction control circuit, the error correction function of the memory device.

19. The method of claim 18, further comprising:
assessing, using the serial data bus, the error correction function on/off register to write a first value indicating the error correction function is to be turned on and a second value indicating the error correction function is to be turned off.

20. The method of claim 15, wherein the memory device comprises a set of mode registers having one or more mode register cells configured to control operational functions of the memory device, the method further comprising:

designating one or more mode register cells in the set of mode registers of the memory device, other than the registers cells configured to control operational functions of the memory device, as the error correction event register.

21. The method of claim 20, further comprising:
designating a mode register cell in the set of mode registers, other than the registers cells configured to control operational functions of the memory device, as a clear event register;

setting the clear event register to an initial value;

setting the clear event register to a second value; and in response to the clear event register having the second value, setting the error correction event register to the first value.

22. The method of claim 15, further comprising:
designating one or more registers in the set of mode registers as address registers; and in response to the error correction event signal being asserted, storing the memory address associated with the corrected memory data in one or more of the address registers.

* * * * *